United States Patent [19]

Tran

[11] Patent Number: 5,144,162
[45] Date of Patent: Sep. 1, 1992

[54] HIGH SPEED SIGNAL DRIVING SCHEME

[75] Inventor: Hiep V. Tran, Carrollton, Tex.

[73] Assignee: Texas Instruments Incorporated, Dallas, Tex.

[21] Appl. No.: 553,207

[22] Filed: Jul. 13, 1990

[51] Int. Cl.$^5$ .................. H03K 17/04; H03K 17/16
[52] U.S. Cl. ........................... 307/443; 307/572
[58] Field of Search ............... 307/443, 480, 481, 572

[56] References Cited

U.S. PATENT DOCUMENTS 4,763,023 8/1988 Spence .................................. 307/451
4,983,860 1/1991 Yim et al. ....................... 307/480 X Primary Examiner—David Mis
Attorney, Agent, or Firm—Stanton C. Braden; Richard A. Stoltz; Richard L. Donaldson

[57] ABSTRACT

A high speed signal driving scheme is disclosed which reduces timing delays associated with a signal line by limiting the voltage transition on the signal line from its precharged voltage.

11 Claims, 7 Drawing Sheets

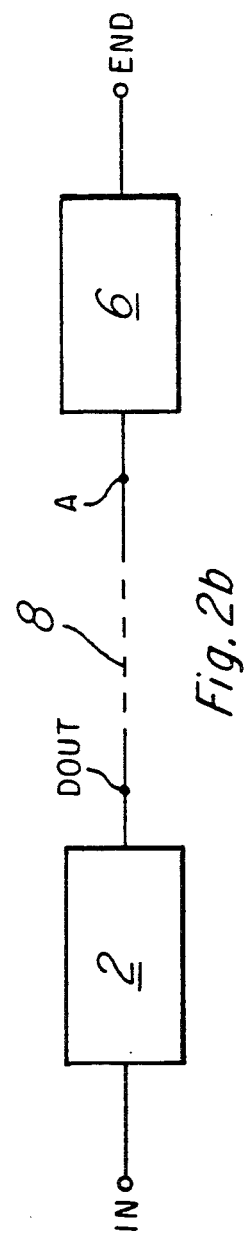
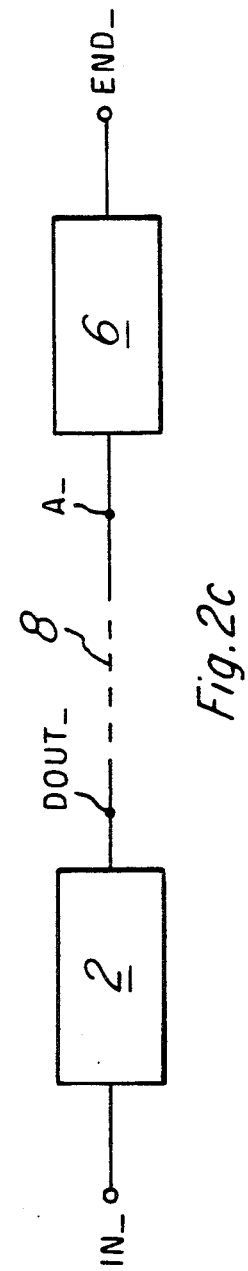

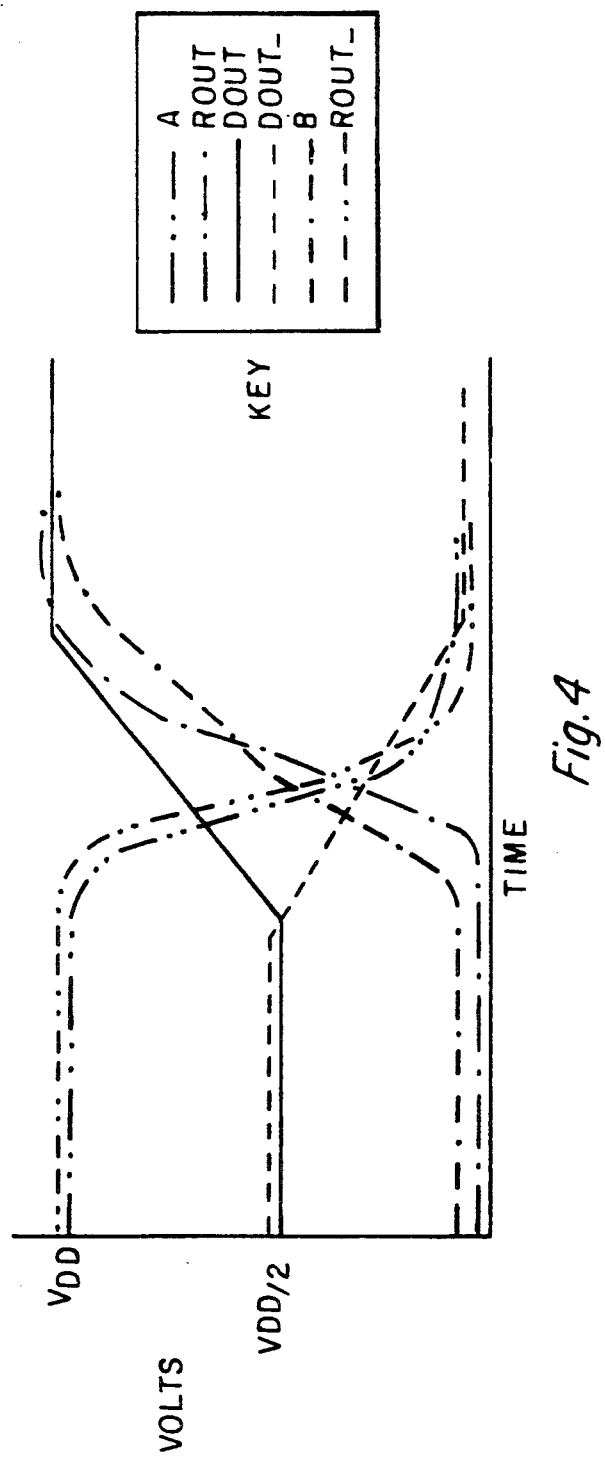

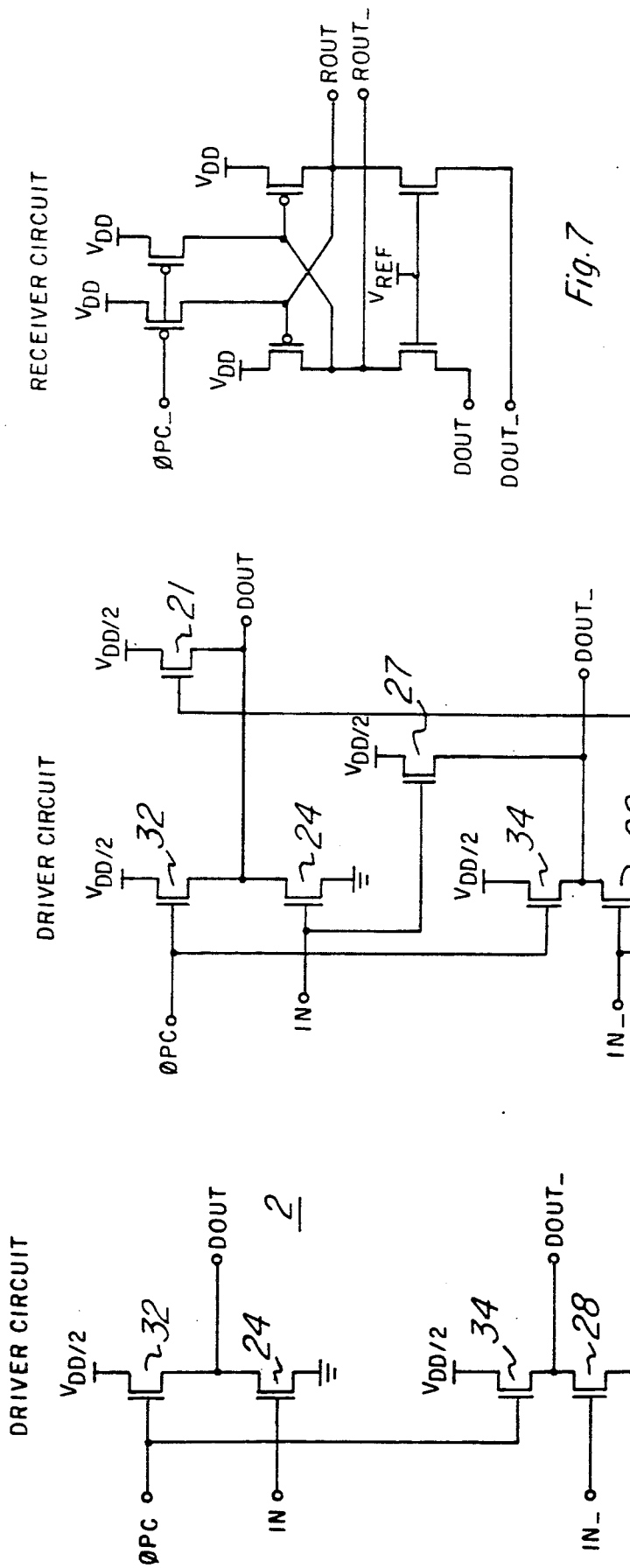

HIGH SPEED SIGNAL DRIVING SCHEME

BACKGROUND OF THE INVENTION

In memories, particularly dynamic random access memories (DRAMs), data and address signals on lines running from one end of a semiconductor chip to another are subject to severe delays in transit along the lines. Such delays are caused by parasitic loading attributed to distributed impedances associated with the lines.

FIG. 1a illustrates a schematic drawing of a conventional driver-to-receiver bus communication scheme. Driver circuit 2, including inverter 4, receives an input signal from input node IN. Driver circuit 2 can, for instance, represent a tri-state driver. Node DOUT at the output of driver circuit 2 is connected to node A, at the input of receiver circuit 6, by line 8 which carries distributed impedances, including distributed resistance, inductance and capacitance. Receiver circuit 6 can, for instance represent a cascoded sensing amplifier.

FIG. 1b illustrates a timing diagram for the circuit of FIG. 1a. As shown, for a transition at node IN from a logic high to a logic low, a transition at node END follows after a delay of time $t_a$. Additionally note that a change in node A, shown in FIG. 1a going from logic low to logic high, takes even longer time $t_a$. Delay time, $t_a$ or longer, adversely affects memory operation in that memory speed is slowed as a result thereof.

This may be particularly true with high density memories, i.e., those of 16 megabit or greater in size.

FIGS. 1c and 1d represent a schematic drawing of a conventional driver-to-receiver communication bus scheme and its associated timing diagram, respectively, of complemented signals (indicated by the bar succeeding the label) of their counterparts shown in FIGS. 1a and 1b.

OBJECTS OF THE INVENTION

It is an object of the invention to provide a high speed signal driving scheme.

It is another object of the invention to provide a reduction in power dissipation for a high speed signal driving scheme.

SUMMARY OF THE INVENTION

The foregoing objects of the invention are accomplished by a signal driving scheme which includes a driver circuit and a receiver circuit wherein the signal lines are precharged to a predetermined voltage which is less than the supply voltage of the receiver and driver circuits.

BRIEF DESCRIPTION OF THE DRAWINGS

FIG. 1b illustrates a timing diagram for the circuit of FIG. 1a.

FIGS. 2b and 2c are diagrams representing the driver-to-receiver scheme.

FIG. 4 illustrates a timing diagram of the foregoing discussed circuits of FIG. 3.

FIG. 5 illustrates a schematic drawing of an alternative embodiment of the invention's driver circuit.

FIG. 6 illustrates a schematic drawing of an improvement of the invention's driver circuit as shown in FIG. 5.

FIG. 7 illustrates an alternative embodiment of the invention's receiver circuit.

DETAILED DESCRIPTION OF THE INVENTION

The invention solves the previously discussed problems associated with parasitic loading by reducing the voltage swing of signal line voltages by half the supply voltage from drivers to their associated receivers.

Figure 1A:
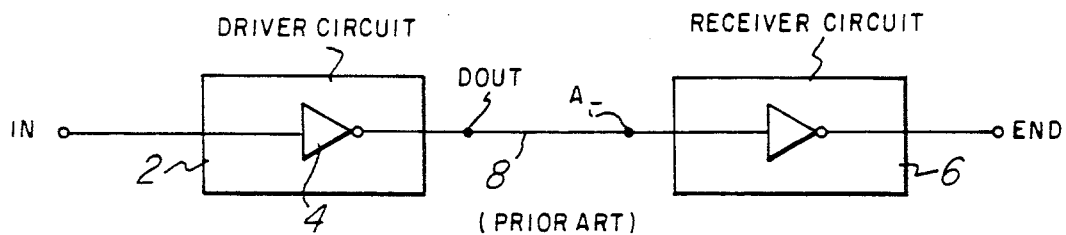
FIG. 1a illustrates a schematic drawing of a conventional driver-to-receiver bus communication scheme.
Figure 1B:
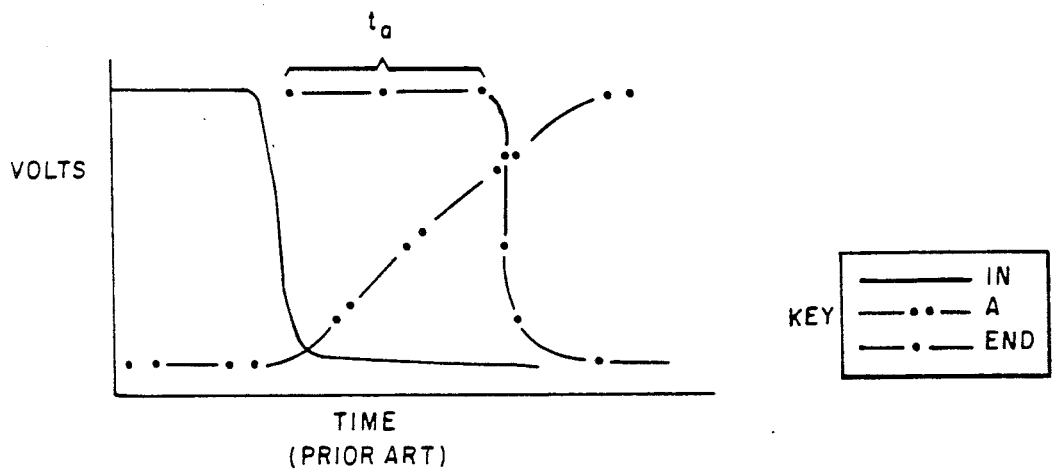
Figure 1C:
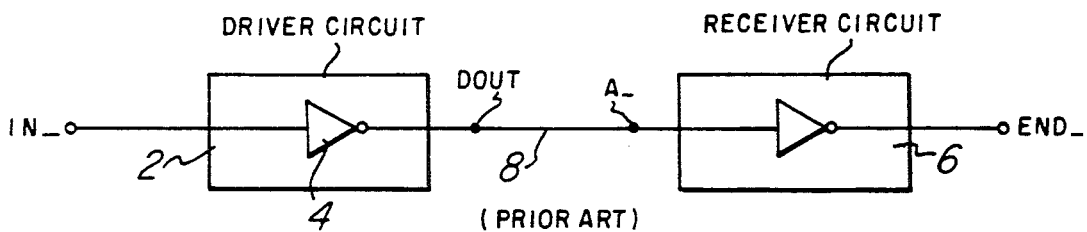
FIGS. 1c and 1d represent a schematic drawing of a conventional driver-to-receiver communication bus scheme and its associated timing diagram, respectively.
Figure 1D:
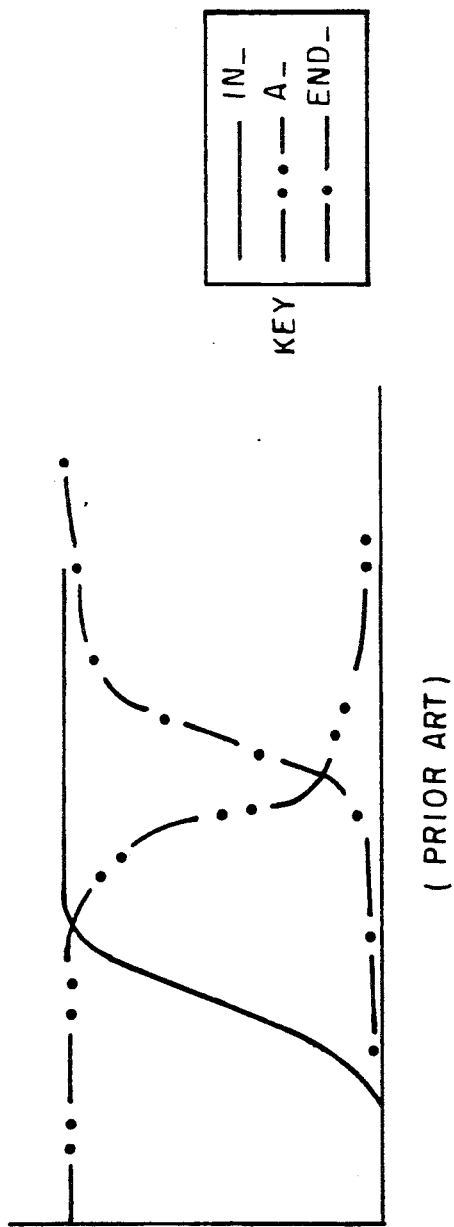
Figure 2A:
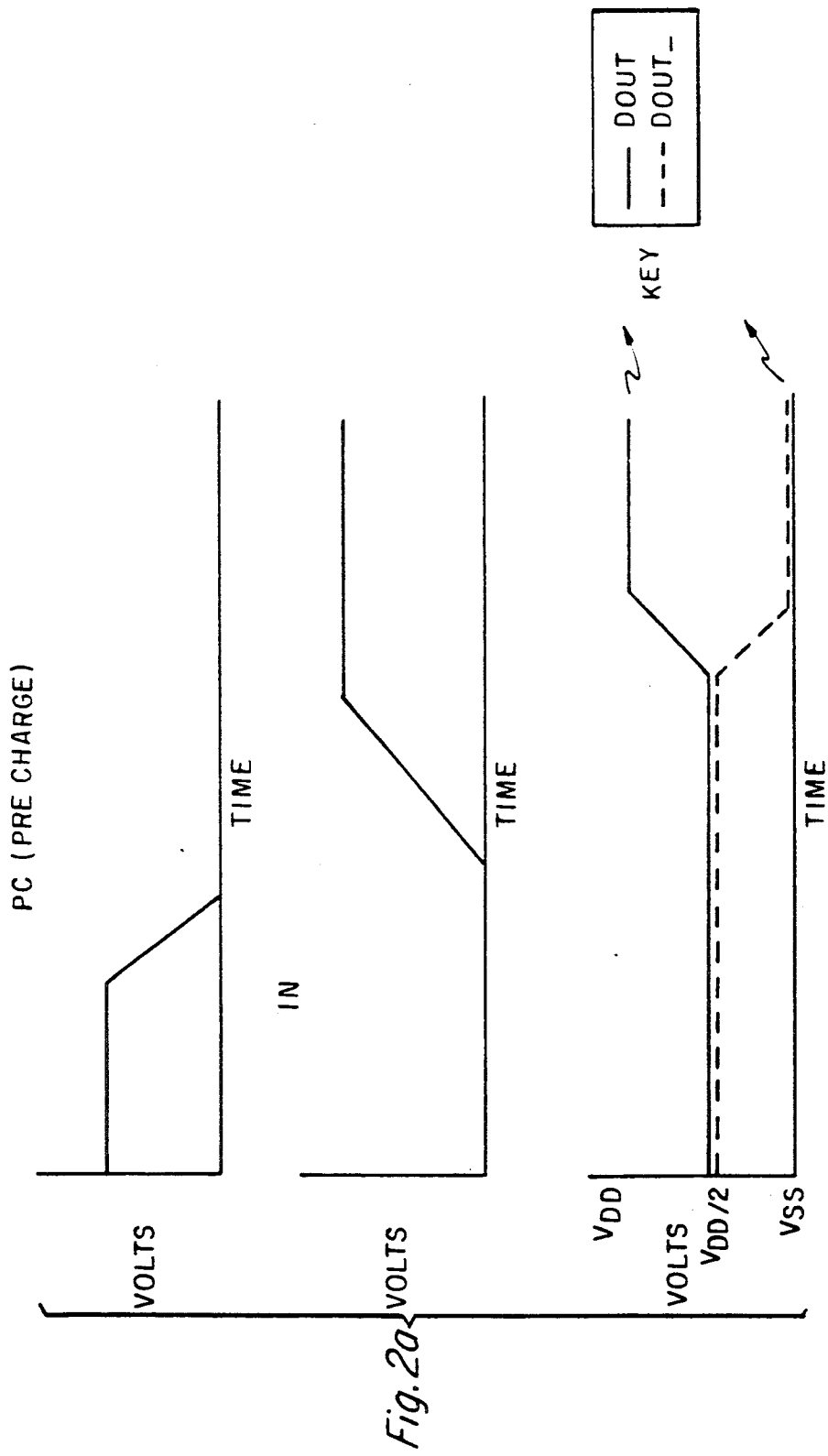
FIG. 2a illustrates a timing diagram of one example of operation, associated with the invention.

FIG. 2a illustrates a timing diagram of one example of operation, associated with the invention. Such a diagram can indicate the timing of the driver-to-receiver scheme shown in the schematic drawings of FIGS. 2b and 2c. Following a precharge of line 8 of FIGS. 2b and 2c, as indicated by the precharge signal transition from high to low of precharge signal PC, the signal at node IN rises from logic low to logic high. The precharge of line 8 results in node DOUT and DOUT_ of FIGS. 2b and 2c respectively, being precharged to a voltage level of $V_{DD}/2$ as shown in FIG. 2a. After node IN attains its logic high level, nodes DOUT and DOUT_ began transition from their precharged voltage levels. In the particular example shown in FIG. 2a, node DOUT rises to a logic high value of voltage $V_{DD}$ while node DOUT_ falls to voltage $V_{SS}$, a logic low value. Note, however, that in another example of operation, node DOUT could have been illustrated so it falls to $V_{SS}$ in voltage from its precharged $V_{DD}/2$ level while node DOUT_ rises to $V_{DD}$ from its $V_{DD}/2$ precharged level. In any case, the voltage transitions that nodes DOUT and DOUT_ must make are substantially reduced as compared with precharging nodes DOUT and DOUT_ to voltage $V_{DD}$ having one of them fall in voltage $V_{SS}$. The reduced precharge voltage thus results in power consumption reduction and increased device speed.

Figure 3:
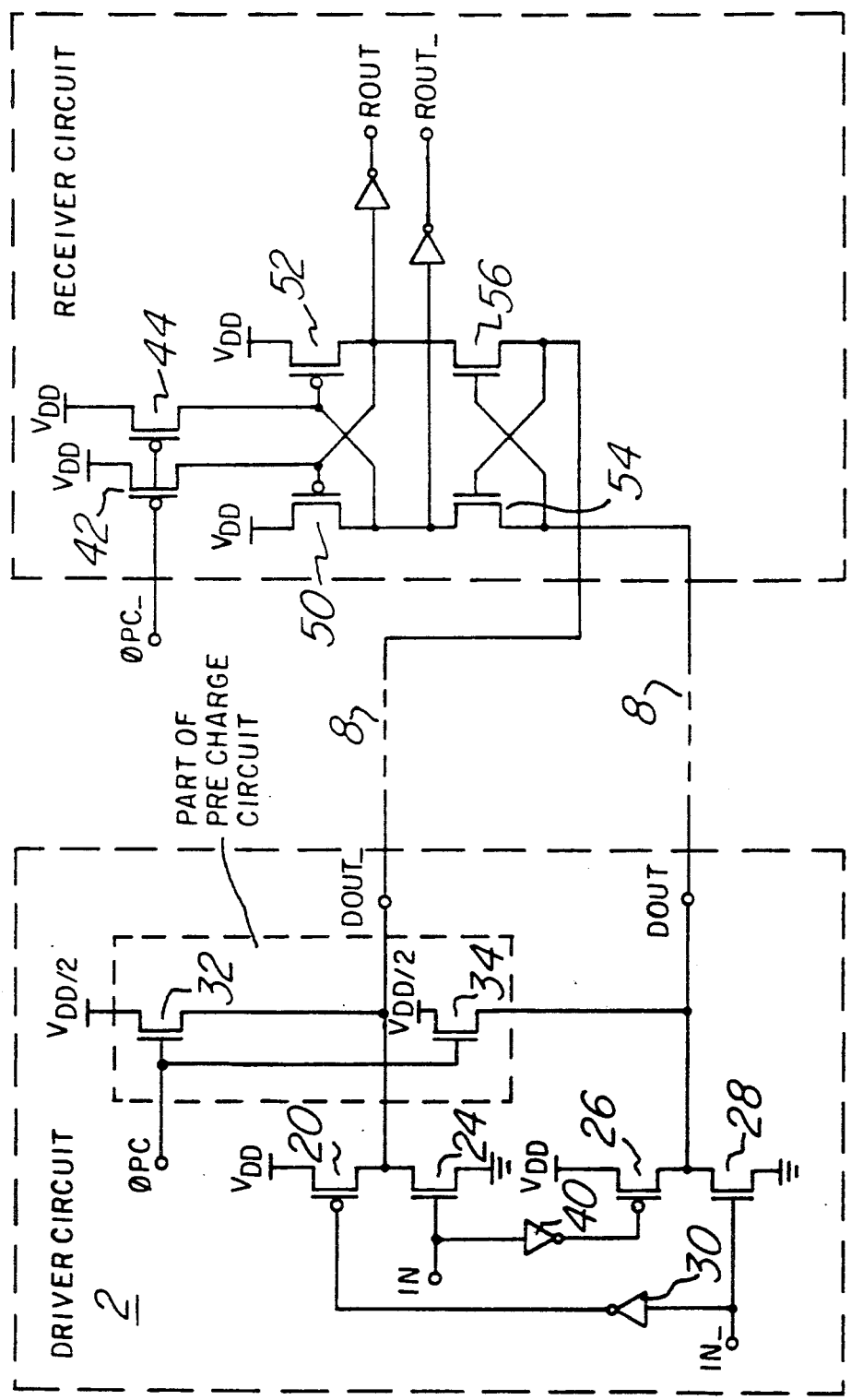
FIG. 3 illustrates a schematic drawing of the invention's driver and receiver circuits.

FIG. 3 illustrates a schematic drawing of the invention's driver and receiver circuits. P-Channel transistors 24, 28 are off during the precharge of line 8 to voltage $V_{DD}/2$ thus the signal at nodes IN and IN_ are at a logic low level during precharge. Precharge of line 8 is accomplished through n-channel transistors 32 and 34 which comprise a precharge circuit which may be part of or stand separate from the driver circuit which turn on in response to a high precharge signal at node PC. Transistors 32 and 34 receive one-half the supply voltage to the remainder of the driver circuit. As shown, node IN for receiving an input signal is connected to the gate of transistor 24. Transistor 26 receives an inverter input signal through inverter 40. Transistor 28 receives the complement of the signal at node IN through its connection to node IN_, and transistor 20 is connected to node IN_ through its connection to inverter 30. When the precharge signal at node PC is turned off, lines 8 are left floating at around their precharge voltage. Next, one of the signals at nodes IN and IN_ is switched to a logic high level resulting in either node DOUT (IN low) being pulled logic low in voltage and node DOUT_ being pulled logic high in voltage or node DOUT_ (IN high) being pulled logic low in voltage and DOUT being pulled logic high in voltage. Receiver circuit 6 receives signals at nodes DOUT and DOUT_ for processing, after its own precharge cycle which occurs via P-Channel transistors 42 and 44. This precharge occurs substantially concurrent with the precharge of driver circuit 2. Receiver circuit 6 has both a true output at node ROUT and a complemented output at node ROUT_. The outputs are preceded by inverters 46 and and 48 respectively which are connected to cross-coupled elements, p-channel transistors 50 and 52 and n-Channel transistors 54 and 56. After precharge, the voltage difference between nodes DOUT and DOUT_, when in excess of the threshold voltage of transistor 54 or transistor 56, will amplify and latch the values at noes ROUT and ROUT_.

FIG. 4 illustrates a timing diagram of the foregoing discussed circuits of FIG. 3. Note that the reduced precharge and transition from a lower voltage of nodes DOUT and DOUT_ result in both a faster and more energy conservative operation.

FIG. 5 illustrates a schematic drawing of an alternative embodiment of the invention's driver circuit. P-channel pull-up transistors 20 and 26 of FIG. 3 have been omitted. Thus, as shown, the circuit of FIG. 5 provides considerable simplification of the driver circuit of FIG. 3. When either transistor 24 or transistor 28 receives a logic high level at its input at nodes IN and IN_ respectively, only line 8 directly connected to that logic high input receiving transistor is pulled low in voltage. The other line 8 remains floating at around its precharge level.

FIG. 6 illustrates a schematic drawing of an improvement of the invention's driver circuit as shown in FIG. 5. During operation, the line 8 which is not being driven is connected to one-half of the supply voltage, $V_{dd}/2$, by n-channel transistor 21 or 27. Thus, only one line 8 is pulled low while the other line 8 remains connected to a precharge voltage, $V_{dd}/2$, through a drain-source path of a turned-on transistor 21 or 27 rather than floating around the precharge voltage as in the driver circuits of FIGS. 3 and 5.

FIG. 7 illustrates an alternative embodiment of the invention's receiver circuit. Transistors 54 and 56 are shown as having their gates connected to a voltage reference source, $V_{REF}$, instead of being cross-coupled in the manner shown in the receiver circuit of FIG. 3. This embodiment provides considerable improvement in many instances over that shown in the receiver circuit of FIG. 3. With cross-coupling, the operating level of transistors 54 and 56 are self-referencing and cannot easily be adjusted. However, the $V_{REF}$ level in FIG. 7 can be easily changed as suited such that the receiver operating speed can be improved.

Although the invention has been described in detail herein with reference to its preferred embodiment and certain described alternatives, it is to be understood that this description is by way of example only, and it is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

I claim:

1. A signal driver which comprises:
    a driver circuit;
    a signal line connected to said driver circuit;
    a precharge circuit, said precharge circuit being operable to precharge said signal line to a predetermined voltage which is less than the supply voltage to said driver and said precharge circuit; and
    a receiver circuit, said receiver circuit being operable to output logic high and logic low voltage levels from said precharged signal line.

2. A signal driver as recited in claim 1 wherein said driver circuit is a complementary signal driver and said receiver circuit is a differential signal receiver.

3. A signal driver as recited in claim 2 wherein said driver circuit is a tri-state driver.

4. A signal driver as recited in claim 2 wherein said receiver circuit is a cascoded sensing amplifier.

5. A signal driver as recited in claim 2 wherein said receiver circuit is capable of outputting a rail to rail voltage level equal to the supply voltage.

6. A signal driver as recited in claim 2 wherein said receiver circuit comprises a pair of field effect transistors with their gates cross coupled to their sources.

7. A signal driver as recited in claim 6 wherein said receiver circuit comprises a complementary pair of circuits which operates in complementary fashion, each complementary pair includes a pair of field effect transistors with their gates cross coupled to their sources.

8. A signal driver as recited in claim 2 wherein said predetermined voltage is substantially one half of said supply voltage to the other circuits.

9. A signal driver as recited in claim 2 wherein said receiver circuit further comprises a pair of field effect transistors which each receive a common reference signal at their gates.

10. A signal driver as recited in claim 1 wherein said precharge circuit includes a precharge transistor and wherein said precharge circuit is operable to charge a second signal line, said signal driver being operable to bring a selected signal line to a predetermined voltage level while connecting the remaining signal line to a predetermined precharge voltage through said precharge transistor.

11. A signal driver as recited in claim 1 which is operable to disconnect said signal line from said precharge circuit charging so as to attain a floating voltage level on said signal line.

* * * * *